(12) United States Patent
Muranaka et al.

(10) Patent No.: US 6,410,454 B1
(45) Date of Patent: *Jun. 25, 2002

(54) METHOD AND APPARATUS FOR REMOVING CONTAMINANTS FROM THE SURFACE OF A SEMICONDUCTOR WAFER

(75) Inventors: Seiji Muranaka; Cozy Ban; Akihiko Osaki, all of Chiyoda-ku (JP)

(73) Assignee: Mitsubishi Denki Kabushiki, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/982,586

(22) Filed: Dec. 2, 1997

(30) Foreign Application Priority Data

Jun. 10, 1997 (JP) ............................. 9-152184

(51) Int. Cl.⁷ ................................. B01J 19/08
(52) U.S. Cl. .................. 438/758; 438/96; 438/158; 438/482; 438/485; 257/59
(58) Field of Search ............... 438/96, 158, 482, 438/485, 758; 257/59

(56) References Cited

U.S. PATENT DOCUMENTS

| 4,981,811 A | | 1/1991 | Feygenson et al. ............ 437/46 |
|---|---|---|---|
| 5,015,330 A | | 5/1991 | Okumura et al. ............ 437/228 |
| 5,089,441 A | | 2/1992 | Moslehi ...................... 437/225 |
| 5,174,881 A | | 12/1992 | Iwasaki et al. .............. 437/228 |
| 5,225,366 A | * | 7/1993 | Yoder .......................... 437/108 |
| 5,273,588 A | | 12/1993 | Foster et al. .............. 118/723 E |
| 5,294,572 A | | 3/1994 | Granneman et al. ........ 437/225 |
| 5,352,636 A | | 10/1994 | Beinglass .................... 437/235 |
| 5,407,867 A | | 4/1995 | Iwasaki et al. .............. 156/643 |
| 5,562,952 A | | 10/1996 | Nakahigashi et al. ........ 427/534 |
| 5,565,036 A | * | 10/1996 | Westendorp et al. ........ 118/723 |
| 5,574,958 A | * | 11/1996 | Kawano ...................... 422/186 |
| 5,976,919 A | * | 11/1999 | Hirao et al. ................. 438/158 |
| 6,214,706 B1 | * | 4/2001 | Madan et al. ............... 438/482 |

FOREIGN PATENT DOCUMENTS

| JP | 56-149306 | 11/1981 |
|---|---|---|
| JP | 61-32429 | 2/1986 |
| JP | 61-247019 | 11/1986 |
| JP | 61-247020 | 11/1986 |
| JP | 61-280623 | 12/1986 |
| JP | 62-67826 | 3/1987 |
| JP | 64-731 | 1/1989 |
| JP | 2-49428 | 2/1990 |
| JP | 3-87373 | 4/1991 |
| JP | 4-127529 | 4/1992 |
| JP | 4-279022 | 10/1992 |
| JP | 6-53137 | 2/1994 |
| JP | 7-86240 | 3/1995 |
| JP | 8-53767 | 2/1996 |
| JP | 9-213633 | 8/1997 |

OTHER PUBLICATIONS

Oda et al. "Hydrogen radical assisted chemical vapor deposition of ZnSe", Appl. Phys. Lett. 48 (1) Jan. 6, 1986 p. 33–35.*

* cited by examiner

Primary Examiner—Keith Christianson
Assistant Examiner—Lisa Kilday
(74) Attorney, Agent, or Firm—McDermott, Will & Emery

(57) ABSTRACT

In a semiconductor wafer-processing, hydrogen gas is introduced into the same chamber as used for film formation and heated to generate hydrogen radicals. Alternatively, a plasma is applied to generate hydrogen radicals, or the semiconductor wafer is heated immediately before film formation. Thereby, contaminants on the surface of the wafer are removed. Thereafter, a conductive film or an insulating film is formed on the wafer in the same chamber.

7 Claims, 4 Drawing Sheets

METHOD AND APPARATUS FOR REMOVING CONTAMINANTS FROM THE SURFACE OF A SEMICONDUCTOR WAFER

TECHNICAL FIELD

This invention relates to a method and apparatus for manufacturing a semiconductor device, and more particularly to a method and apparatus for removing contaminants from the surface of a semiconductor wafer within the same chamber as used for film formation.

BACKGROUND ART

Recent progress in fineness of semiconductor devices reveals the degradation of device characteristics owing to re-growth of a natural oxide film and re-deposition of organic contaminants after cleaning of a semiconductor wafer in a manufacturing process, which has not been such a serious problem in the past.

FIG. 7 shows a diagram illustrating a conventional method and system including a cleaning apparatus and a film-forming apparatus. In a conventional semiconductor fabrication process, surface cleaning, which influences the characteristics of the device, is effected immediately before formation of films such as a gate oxide film, electrode layers, a capacitor dielectric film, etc. For this purpose, wet cleaning apparatus such as pre-diffusion treatment apparatus, light etching apparatus or the like has been generally used.

Various techniques have been proposed with regard to a cleaning apparatus or a film-forming apparatus. Examples of such proposals include those set out in Japanese Laid-open Patent Application Nos. 4-279022, 3-224222, 61-32429, 3-87373, 7-507844, 8-53767 and 61-280623.

However, in a conventional flow of a manufacturing process, wet cleaning is performed prior to a film-forming step, and a semiconductor wafer is transferred to a film-forming apparatus to form a film thereon. Therefore, it is very likely to suffer various contamination during the course of the film-forming steps after the cleaning. Such contamination may be due to a contamination suffering from an atmosphere of clean room prior to a temporary storage of a wafer in a casing, a contamination from the casing or cassette during the storage, and a contamination from an operator or a robotic system carrying the wafer to a film-forming apparatus. Further, the contamination may be caused when a wafer is transferred from a cleaning apparatus to a film-forming position in a film-forming apparatus, or when a pressure in the film-forming apparatus is reduced or a gas is fed to the apparatus.

SUMMARY OF THE INVENTION

Accordingly, it is an object of the present invention to provide a method and an apparatus for manufacturing a semiconductor device having improved reliability, and more particularly a method and an apparatus for removing contaminants on the surface of a semiconductor wafer in a film-forming apparatus immediately before film formation, by which the problems involved in the prior art techniques are overcome.

In other words, it is an object of the present invention to provide a method and apparatus which are able to suppress surface contamination during cleaning and film-forming process of a semiconductor wafer to obtain a surface or film showing good characteristics.

According to one aspect of the present invention, in a method for manufacturing a semiconductor device, a semiconductor wafer is placed in a film-forming chamber, and contaminants on the surface of the semiconductor wafer are removed in the film-forming chamber. Then, immediately after the removal of the contaminants, either a conductive film or an insulating film is formed on the surface of the wafer in the same film-forming chamber.

In another aspect of the present invention, in the method for manufacturing a semiconductor device, hydrogen gas or a hydrogen halide gas is introduced into the film-forming chamber via a flow rate control means. Then, the introduced hydrogen gas or hydrogen halide is heated in the film-forming chamber to generate hydrogen radicals in the film-forming chamber. Thus, contaminants are removed from the surface of the semiconductor wafer.

The hydrogen gas or hydrogen halide may be heated, for example, by means of a hot filament in the film-forming chamber.

In another aspect of the present invention, in the method for manufacturing a semiconductor device, hydrogen gas or a hydrogen halide gas is introduced into the film-forming chamber via a flow rate control means. Then, a plasma is generated in the film-forming chamber so that the semiconductor wafer is covered with the plasma which generates hydrogen radicals. Thus, contaminants are removed from the surface of the semiconductor wafer.

The plasma may be generated in different exciting frequencies simultaneously.

In another aspect of the present invention, in the method for manufacturing a semiconductor device, hydrogen gas or a hydrogen halide gas is introduced into the film-forming chamber via a flow rate control means. Then, the semiconductor wafer is heated from outside of the film-forming chamber. Thus, contaminants are removed from the surface of the semiconductor wafer.

The semiconductor wafer may be preferably heated at a temperature ranging from 500 to 1200° C.

In another aspect of the present invention, in the method for manufacturing a semiconductor device, hydrogen gas or a hydrogen halide gas is introduced into the film-forming chamber via a flow rate control means. Then, the semiconductor wafer is heated from outside of the film-forming chamber. Simultaneously, a plasma is generated in the film-forming chamber so that the semiconductor wafer is covered with the plasma which generates hydrogen radicals. Thus, contaminants are removed from the surface of the semiconductor wafer.

According to another aspect of the present invention, an apparatus for manufacturing a semiconductor device comprises a film-forming chamber for forming a film on a semiconductor wafer. Means is provided for introducing hydrogen gas or a hydrogen halide gas via a flow rate control means into the film-forming chamber. Wafer heating means is provided for heating the semiconductor wafer from outside of the film-forming chamber. Thus, contaminants on the surface of the semiconductor wafer are removed.

In another aspect of the present invention, the apparatus for manufacturing a semiconductor device further comprises a load lock chamber for introducing a semiconductor wafer. The load lock chamber is connected to the film-forming chamber, and is used to transfer the semiconductor wafer to the film-forming chamber in a continuous vacuum condition.

In another aspect of the present invention, a semiconductor manufacturing system comprises a plurality of apparatuses each for removing contaminants on a surface of a semiconductor wafer and forming either a conductive film or an insulating film on said surface of said wafer in a film-forming chamber immediately after the removal of said contaminants. A transfer chamber is provided to which each of the film-forming chamber of the apparatuses is connected, and a continuous vacuum may be established therebetween. Then, a semiconductor wafer may be transferred in a continuous vacuum condition to the film-forming chamber and may be subjected to film formation.

According to another aspect of the present invention, an apparatus for manufacturing a semiconductor device comprises a film-forming chamber for forming a film on a semiconductor wafer. Means is provided for introducing hydrogen gas or a hydrogen halide gas via a flow rate control means into the film-forming chamber. Gas heating means is provided for heating the introduced hydrogen gas or hydrogen halide gas in the film-forming chamber to generate hydrogen radicals whereby contaminants on the surface of the semiconductor wafer are removed.

The gas heating means may be a hot filament.

The hot filament may comprise a metal material serving as a catalyst for hydrogen radical formation reaction.

A metal material serving as a catalyst for hydrogen radical formation reaction may be provided in the vicinity of the hot filament.

According to another aspect of the present invention, an apparatus for manufacturing a semiconductor device comprises a film-forming chamber for forming a film on a semiconductor wafer. Plasma generating means is provided which includes a pair of plasma generating electrodes disposed within the film-forming chamber, and a power supply means for supplying a high frequency voltage to the paired electrodes. Thus, a plasma is generated to form hydrogen radicals with which contaminants on the surface of the semiconductor wafer are removed.

The power supply means may supply high frequency voltages of different frequencies simultaneously.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

The present invention will be described in further detail by way of example with reference to the accompanying drawings, in which like reference numerals indicate like parts or members.

BEST MODE OF CARRYING OUT INVENTION

First Embodiment

Figure 1:
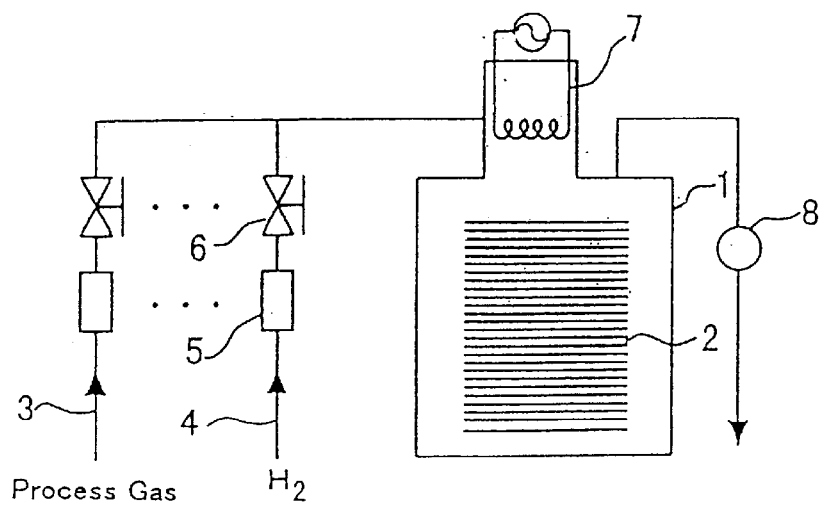
FIG. 1 is a schematic view snowing a method and an apparatus for surface cleaning and film formation of a semiconductor wafer according to a first embodiment of the present invention.

FIG. 1 is a schematic view showing a method and an apparatus for surface cleaning and film formation of a semiconductor wafer according to a first embodiment of the present invention.

In FIG. 1, there is shown a film-forming chamber 1, in which a semiconductor wafer 2 is disposed. A process gas feed line 3 is connected to the chamber 1 to supply a process gas used to form a film on the wafer 2. A hydrogen gas feed line 4 is also provided, as shown, in order to supply hydrogen gas for cleaning of the wafer 2.

The line 4 includes a gas flow rate control means 5 such as a mass flow controller (MFC) (which may be sometimes referred to simply as MFC hereinafter), and a valve 6 for controlling the gas feed. The chamber 1 also comprises a heating filament 7 for heating a hydrogen gas being supplied therein. A vacuum pump 8 is provided for evacuating the chamber 1.

The manner of cleaning is described below. In the present invention, the wafer 2 is cleaned immediately before the formation of a film on the wafer 2.

First, the chamber 1 is evacuated by means of the vacuum pump 8, after which hydrogen gas is introduced from the feed line 4 into the chamber 1 while controlling its flow rate at 10 sccm by means of the MFC 5 and the valve 6. The inner pressure of the chamber 1 is stabilized at a level of 13.3 to 1330 Pa (i.e. 0.1 to 10 Torr.), after which the hydrogen is heated by means of the hot filament 7 in order to generate hydrogen radicals.

The hot filament 7 is preferably made of a metal material, which serves as a catalyst for hydrogen radical formation reaction, in order to facilitate the formation reaction.

Figure 2:
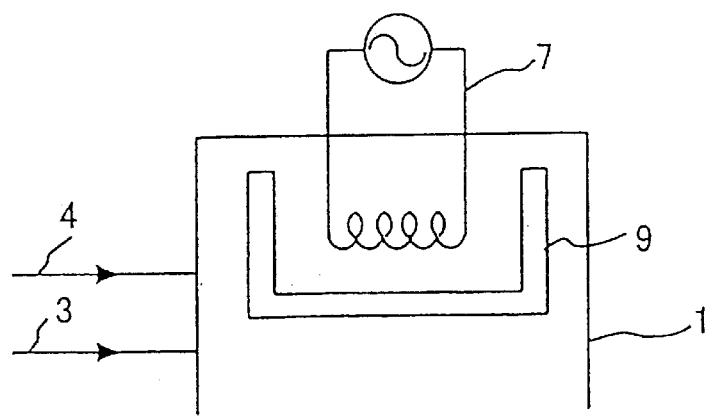
FIG. 2 shows a metal material serving as a catalyst provided in the vicinity of the hot filament according to a first embodiment of the present invention.

Alternatively, a metal material 9, serving as a catalyst as mentioned above, may be provided in the vicinity of the hot filament 7 as shown in FIG. 2. Still alternatively, the metal material 9 may be provided so that the hot filament is covered therearound. In this way, the catalytic reaction is facilitated to decompose the hydrogen, thereby actively generating hydrogen radicals. The metal materials serving as the catalyst should preferably be selected from Ti, Pt, Ni, V, Mg, Mn, Ta, their alloys, and mixtures thereof.

The hydrogen radicals generated in this manner are brought into contact with the surface of the wafer 2 to remove contaminants on the surface of the wafer 2 immediately before subsequent processing.

Thereafter, a starting process gas is introduced from the feed line 3 into the chamber 1 without introducing any atmosphere from outside or room air into the chamber 1. Thus, the wafer 2 is subjected to film formation.

The hydrogen gas is used as a cleaning gas for the wafer 2 as described above. Instead of hydrogen gas, hydrogen halide gases, such as HCl, HBr, HI and the like, may be used.

The removal of contaminants with the hydrogen radicals includes the following process. Organic material containing elements such as C, H, O and the like are decomposed with hydrogen radicals similar to the way in which carbon C is converted into low molecular weight hydrocarbons such as alkanes and alkynes, oxygen O is converted into H2O, and nitrogen N is converted into NH3. Natural oxide film such as SiO2 is decomposed such that Si is converted into volatile gases such as SiH4, SiO and Si(OH)4, and O is converted into H2O. Inorganic materials, such as other metal elements existing in or on the natural oxide film, are removed along with the natural oxide film.

As discussed above, the contaminants on the wafer surface are removed by heating hydrogen gas or a hydrogen halide gas with a hot filament and bringing the resultant hydrogen radicals into contact with the wafer surface.

In this embodiment, after complete cleaning of the wafer surface, a film is formed on the thus cleaned surface.

After completion of the cleaning, various films may be formed including a polysilicon film, an oxide film or a metal electrode film.

This embodiment is particularly suitable for the fabrication of a semiconductor device wherein a semiconductor substrate made, for example, of atomic silicon or non chemical compound silicon is first cleaned and then has a film formed thereon.

According to the present embodiment, it is not necessary to transfer the semiconductor wafer to a film-forming apparatus after cleaning prior to a film-forming step. Accordingly, various contamination factors involved in the prior art during the process from a cleaning step of a wafer to a film-forming step can be eliminated. Eventually, a surface or a film exhibiting good characteristics can be formed.

Since the removal of contaminants and the film formation can be performed in the same chamber, the throughput is improved.

In this embodiment, highly active radicals are used to remove different types of contaminants including organic material. Thus, it can be expected to improve the reliability of an oxide film and to suppress contact resistance from increasing.

Moreover, the use of hydrogen or a hydrogen halide as a cleaning gas, prior to the formation of any film, is advantageous in that the wafer surface does not substantially suffer damage by etching.

Second Embodiment

Figure 3:
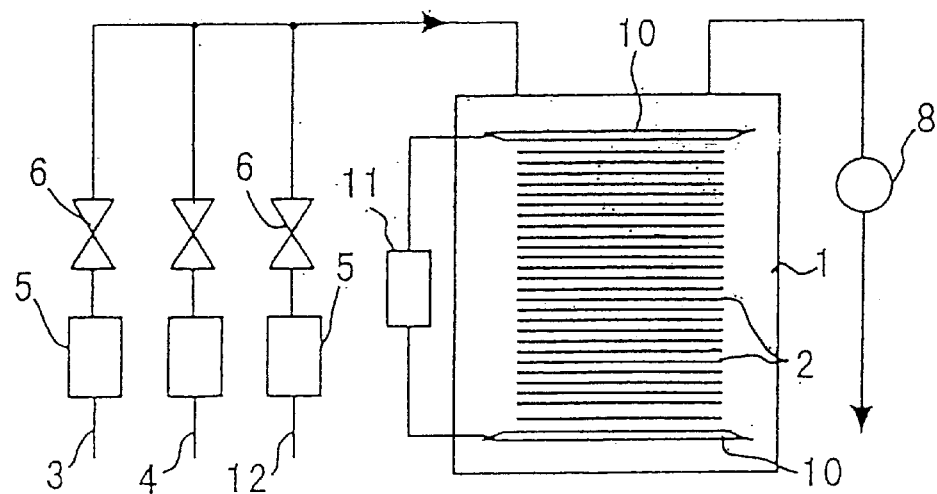
FIG. 3 shows a schematic view of a method and apparatus for surface cleaning of a semiconductor wafer in a semiconductor-fabricating process according to a second embodiment of the present invention.

FIG. 3 shows a schematic view of a method and apparatus for surface cleaning of a semiconductor wafer, immediately before film formation, in a semiconductor-fabricating process according to a second embodiment of the present invention.

In FIG. 3, reference numeral 10 indicates a pair of plasma generating electrodes provided to sandwich a plurality of wafers 2 therebetween in the film-forming chamber 1. Reference numeral 11 indicates a power supply means or a high frequency power supply from which a high frequency voltage is applied to the paired electrodes 10, and reference numeral 12 indicates a line for feeding a plasma-generating gas. A plasma generating means is constituted of these means mentioned above.

The manner of cleaning in this embodiment is described below.

Prior to film formation on the wafer 2, the chamber 1 is drawn to vacuum by means of the vacuum pump 8. Thereafter, hydrogen gas is charged into the chamber 1 from the line 4 while controlling the flow rate of the hydrogen gas at 10 sccm by means of the MFC 5 and the valve 6.

Next, a high frequency voltage (e.g. 13.56 MH) is applied to the paired electrodes 10 to cause a plasma in the hydrogen gas, thereby generating hydrogen radicals. The hydrogen radicals are brought into contact with the wafers 2 to remove contaminants on the surface of the wafers 2.

As for the plasma, an Electron Cyclotron Resonance (ECR) plasma may be effectively used. According to this technique, a high density plasma at low pressure, by application of a magnetic field without any electrodes which may be a contamination source, can be formed. The ECR plasma generating conditions are set, for example, at a microwave frequency of 2.45 GHz, a magnetic field of 875 Gausses, and an inner pressure in a film-forming apparatus of $1.33 \times 10^{-2}$ Pa (i.e. $1 \times 10^{-4}$ Torr.).

In this embodiment, a hydrogen halide gas such as HCl, HBr, HI or the like may be used as a gas for generating radicals, thereby improving cleaning properties.

Alternatively, in the plasma generating technique, an inert gas such as Ar, He or the like may be introduced from the line 12 shown in FIG. 3 as a plasma-generating gas prior to the introduction of hydrogen gas into the chamber 1. When the hydrogen gas is introduced after generation of a stable plasma of the plasma-generating gas, hydrogen radicals can be furnished stably. Additionally, it becomes possible to stabilize the hydrogen plasma and to reduce damages of a wafer surface owing to the plasma.

Alternatively, a two frequency plasma power supply (e.g. 13.56 MHz and 27.12 MHz) may be used as the high frequency power supply to generate two frequency plasmas. Thereby, an excitation efficiency becomes so high that radicals can be generated very efficiently and effectively.

After the removal of contaminants on the wafer surface, a starting process gas is introduced into the chamber 1 from the line 3 to subject the wafer 2 to a film formation process without introducing any atmosphere or room air into the chamber 1.

As described above, according to this embodiment, contaminants on the wafer surface can be removed by exciting hydrogen gas or a hydrogen halide gas with a plasma to generate hydrogen radicals, and bringing the thus generated hydrogen radicals into contact with a wafer surface.

After completion of the cleaning of the surface with the plasma, the resultant wafer may be subjected to various steps including a CVD step, a thermal oxidation step, an annealing step, and a sputtering step. More particularly, a subsequent film formation step can be performed in a cleaned state without exposure to air.

Since a plasma is generated by application of a high frequency in this embodiment, the wafer is not electrically charged, and thus, will not suffer any damage thereof.

The removing procedure of this embodiment is particularly suitable for use in the manufacture of a semiconductor device wherein a semiconductor substrate made, for example, of atomic silicon, rather than compound silicon, is cleaned and then has a film formed thereon.

Moreover, it is not necessary in this embodiment to transfer a semiconductor wafer to a film-forming apparatus after cleaning. Accordingly, contamination factors as involved in the prior art during the course from the cleaning to film-forming steps can be appropriately eliminated, like the first embodiment. Thus, a surface exhibiting good characteristics can be formed on the film or films.

Since the removal of contaminants and the film formation are feasible within the same chamber, the throughput is improved.

In the same way as the first embodiment, highly active radicals are used in this embodiment to remove different types of contaminants including organic material. Thus, improvement of the reliability of an oxide film and suppression of a contact resistance from increasing may be achieved.

Moreover, the use of hydrogen or a hydrogen halide as a cleaning gas, prior to the formation of any film, is advantageous in that the wafer surface does not suffer from damage by etching.

Third Embodiment

Figure 4:
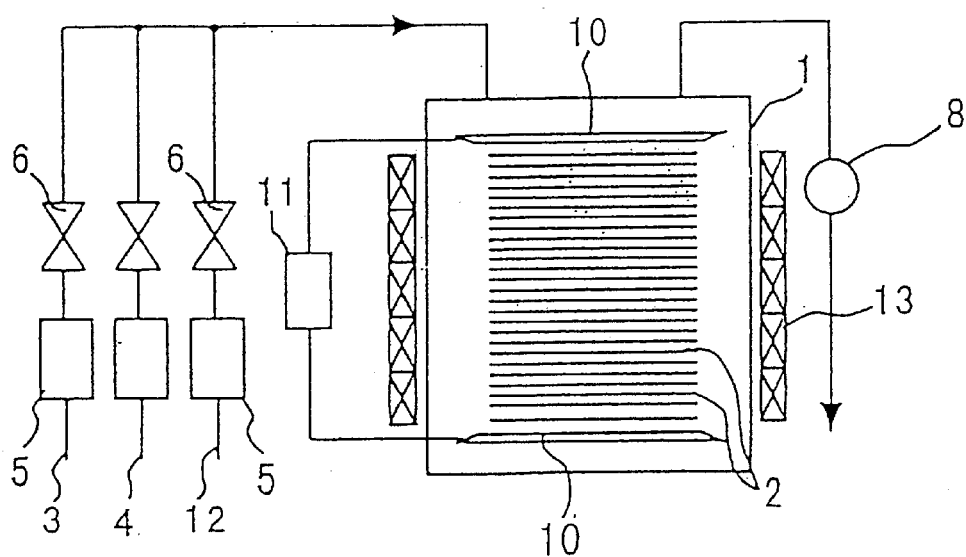
FIG. 4 is a schematic view showing a method and apparatus for the surface cleaning of a semiconductor wafer in a semiconductor fabricating process according to a third embodiment of the present invention.

FIG. 4 is a schematic view showing a method and apparatus for the surface cleaning of a semiconductor wafer in a semiconductor fabricating process according to a third embodiment of the present invention.

In FIG. 4, reference numeral 13 indicates a heating means (e.g. a heater or an IR heater) disposed outside the film-forming chamber 1. This heating means is used to heat the wafer 2 from outside of the chamber 1.

The manner of cleaning is described below.

Prior to the film formation on the wafer 2, the film-forming chamber 1 is drawn to vacuum by means of the vacuum pump 8. Hydrogen gas is charged into the chamber 1 from the line 4 while controlling the flow rate at 10 sccm by means of the MFC 5 and the valve 6 as in the foregoing embodiments.

Next, the wafer 2 in an atmosphere of hydrogen gas is heated by means of the IR heater 13 from outside of the chamber 1, and the temperature of the wafer 2 is raised. In this way, contaminants on the surface of the wafer 2 are removed.

Hydrogen halide gases, such as HCl, HBr, HI and the like, may be used as the atmospheric gas as an alternative to hydrogen.

When a Si wafer is baked in a high vacuum at a temperature of 800 to 850° C., the natural oxide film formed on the wafer disappears, and a surface superstructure is formed on the Si surface, thereby contaminants absorbed on the surface are removed.

In this embodiment, the wafer is baked in an atmosphere of hydrogen gas, under which not only contaminants on the wafer surface are removed by means of the hydrogen gas, but also the surface is cleaned by application of heat thereto. Thus, the cleaning ability is improved.

In the removal of contaminants on the wafer surface by baking in an atmosphere of hydrogen as in this embodiment, the surface temperature of the wafer may preferably be in the range of 500 to 1200°, and more preferably from 800 to 850°. This temperature is effective in enhancing cleaning ability.

The third embodiment has similar effects as illustrated with respect to the first and second embodiments.

The third embodiment may be performed at the same time in combination with the first or second embodiment. Hydrogen gas is heated by means of a hot filament or hydrogen radicals are produced by using a plasma in hydrogen gas, and the radicals are brought into contact with a wafer surface. Then, since the wafer is heated, the reactions to eliminate contaminants become active, thereby improving the cleaning ability on the wafer surface.

A process of fabricating a semiconductor device including the surface cleaning procedures of a semiconductor wafer having described in the foregoing embodiments will be illustrated.

In general, a fundamental process for fabricating a transistor is set forth below.

(1) Formation of active regions of a semiconductor wafer involves the sequential steps of *cleaning, #oxidation, #nitrating, photolithography, etching, removal of the resist, cleaning, #ion implantation, #oxidation, etching, and removal of resist.

(2) Formation of a gate structure involves the sequential steps of *cleaning, #oxidation, #deposition of electrode material, photolithography, etching, and removal of resist.

(3) Formation of a source drain structure involves the sequential steps of *cleaning and #ion implantation.

(4) Formation of an interlayer insulating film involves the sequential steps of *cleaning, #deposition of oxide film, etching, and removal of resist.

(5) Formation of interconnections involves the sequential steps of *cleaning, #deposition of interconnection materials, photolithography, etching, and removal of resist.

In the above-indicated process, it is conventional that the cleaning step marked by "*" and the subsequent film-forming steps marked by "#" are, respectively, carried out in a cleaning apparatus and in a film-forming apparatus separately.

In contrast, in the present invention, a cleaned surface is obtained immediately before film formation in the same film-forming apparatus. After the cleaning step as marked by "*", dry cleaning is again carried out using, for example, hydrogen gas in the film-forming chamber as set out in the foregoing embodiments. After the dry cleaning, a film-forming step is further effected in the same chamber. Thus, contamination factors involved in the transfer of a semiconductor wafer can be suppressed, thereby leading to the formation of surfaces or films exhibiting good characteristics.

Fourth Embodiment

Figure 5:
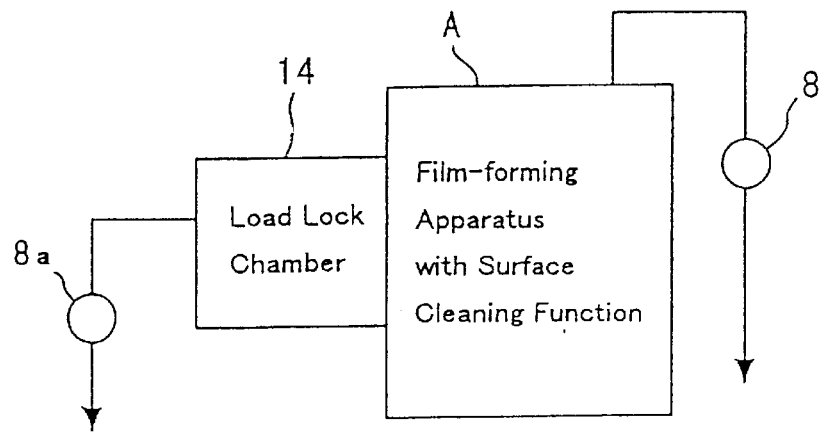
FIG. 5 is a schematic view showing a method and apparatus for the surface cleaning of a semiconductor wafer in a semiconductor-fabricating process according to a fourth embodiment of the present invention.

FIG. 5 is a schematic view showing a method and apparatus for the surface cleaning of a semiconductor wafer in a semiconductor-fabricating process according to a fourth embodiment of the present invention.

In FIG. 5, a reference A indicates a film-forming apparatus which has the function of surface cleaning performed immediately before film formation as has been illustrated in the first to third embodiments. Reference numeral 14 indicates a load lock chamber storing semiconductor wafers prior to film formation, and reference numeral 8a indicates a vacuum pump. The load lock chamber 14 is communicated, in a continuous vacuum condition, with the film-forming apparatus A, so that a semiconductor wafer can be transferred to the film-forming apparatus A at the time of film formation without being exposed to air.

As will be apparent from the above, when the load lock chamber 14 is disposed in association with the film-forming apparatus which has the surface cleaning function as described in the first to third embodiments, contaminants or particles which will be undesirably introduced during evacuation of the film-forming chamber can be suppressed, and a process time can be shortened.

Fifth Embodiment

Figure 6:
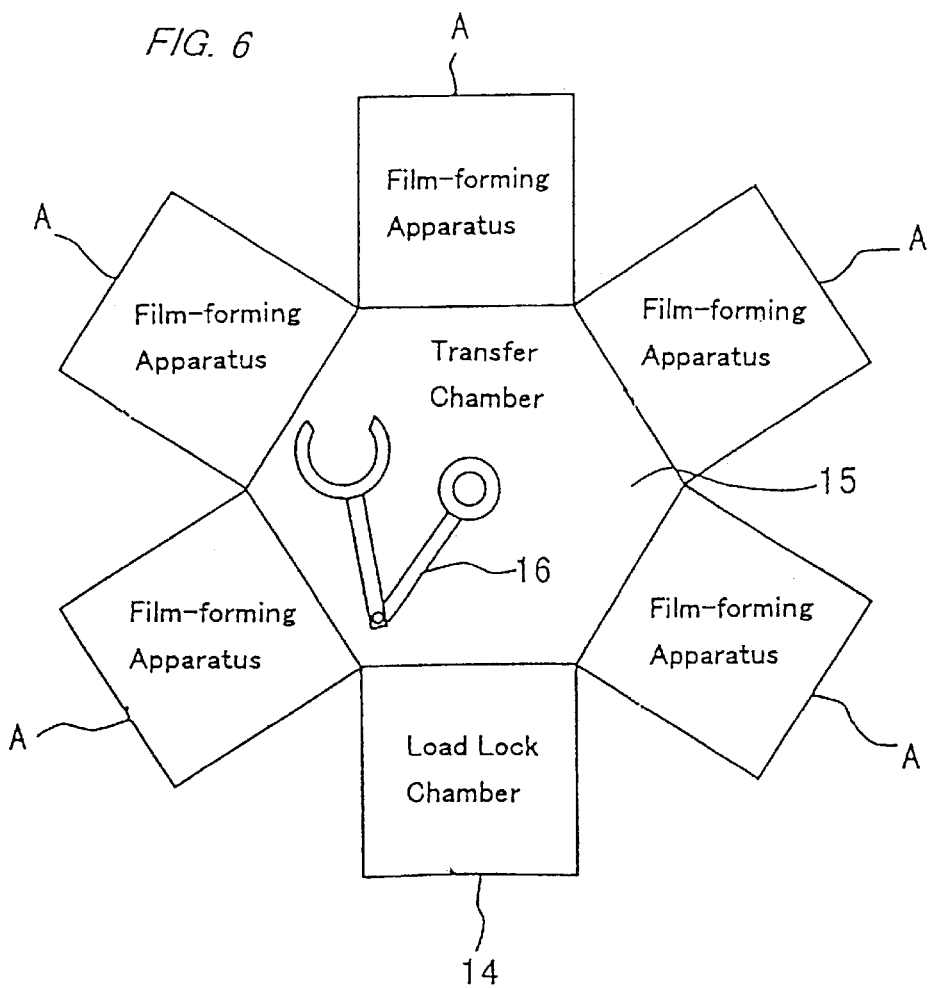
FIG. 6 is a schematic view showing another method and apparatus for the surface cleaning of a semiconductor wafer in a semiconductor-fabricating process according to a fifth embodiment of the present invention.
Figure 7:
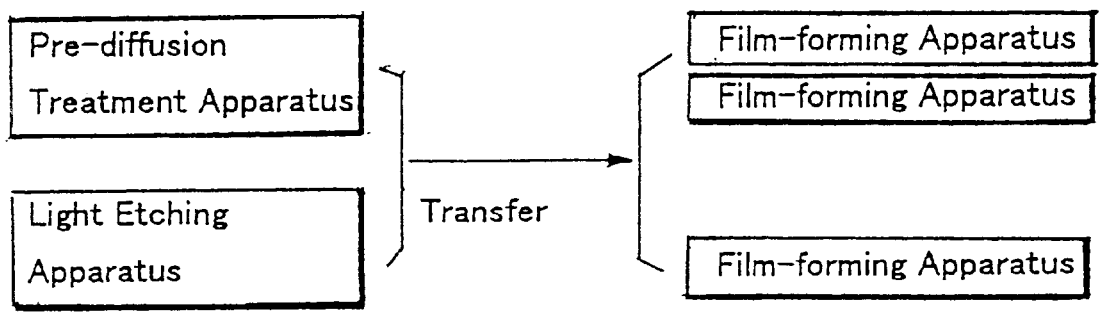
FIG. 7 shows a diagram illustrating a conventional method and system including a cleaning apparatus and a film-forming apparatus.

FIG. 6 is a schematic view showing another method and apparatus for the surface cleaning of a semiconductor wafer in a semiconductor-fabricating process according to the fifth embodiment of the present invention.

In FIG. 6, reference numeral 15 indicates a transfer chamber and a reference numeral 16 indicates a transfer arm. In this embodiment, a plurality of film-forming chambers A are connected to the load lock chamber 14 via the transfer chamber 15, by which a continuous vacuum condition is maintained. A semiconductor wafer 2 is transferred by means of the transfer arm 16 from the load lock chamber 14 to one of the film-forming apparatuses A without being exposed to air. In the apparatus A, cleaning and film-forming steps are carried out as described either in the first to third embodiments. Thereafter, the wafer 2 is transferred to another film-forming apparatus A by means of the transfer arm 16 in order to form another type of film thereon.

In this way, a cluster system may be assembled in which a plurality of film-forming apparatuses, each of which has the function of surface cleaning immediately before film formation as illustrated in the first to third embodiments of the invention, are connected via the load lock chamber 14 and the transfer chamber 15 in a continuous vacuum condition. Then, the wafer 2 may be transferred to the respective film-forming apparatuses A one by one by means of the transfer arm 16. Thus, the wafer 2 can be continuously processed without being exposed to air.

For example, when a MOS transistor is fabricated by use of the cluster system as described above, the films, such as SiO2 serving as a gate insulating film, or polysilicon, Ti, TiN or WSi film serving as an electrode, can be formed without being exposed to air which may contain contaminants. Thus, the surface cleaning just prior to a film formation becomes more effective in suppressing deterioration of device characteristics ascribed to the contamination with particles or organic material or the contamination with metals.

As described above, according to this embodiment, a load lock chamber from which a wafer is transferred to individual film-forming apparatuses is provided. By the provision of the load lock chamber, the particles produced at the time of evacuation of a chamber of the film-forming apparatus are suppressed, and the processing time can be shortened.

Further, a plurality of film-forming apparatuses, each of which has the function of surface cleaning immediately before film formation, are connected through a load lock chamber and a transfer chamber. Thereby, a semiconductor wafer can be continuously processed via the transfer chamber without being exposed to air.

Further, the removal of contaminants and film formation can be performed in the same chamber, and a wafer is transferred to a subsequent step without being exposed to air. Therefore, dust or contaminants are hardly generated accompanying the transfer. In addition, the removal of contaminants and film formation performed in the same chamber results in an improved throughput.

As a matter of course, the effects and advantages attained in the first to third embodiments are likewise obtained in this embodiment.

The effects or advantages of the present invention are summarized as follows.

As will be apparent from the foregoing, according to one aspect of the present invention, hydrogen gas or a hydrogen halide is heated by means of a hot filament, and the resultant hydrogen radicals are brought into contact with a wafer surface, thereby removing contaminants on the wafer surface. The active radicals of high reactivity are effective in removing various types of contaminants, including organic material. Thus, improvement in the reliability of an oxide film and suppression of contact resistance from increasing can be expected. The use of hydrogen or a hydrogen halide as a gas for the removal of contaminants is advantageous in that the surface of the semiconductor wafer suffers no damage as may be caused by etching. This cleaning method is particularly suitable for use in the manufacture of a semiconductor device wherein a non-compound semiconductor substrate is cleaned and a film is formed thereon.

According to another aspect of the present invention, hydrogen gas or a hydrogen halide gas is excited by means of a plasma to generate hydrogen radicals. The hydrogen radicals are brought into contact with a wafer surface to remove contaminants thereon. The active radicals of high reactivity can effectively remove various types of contaminants including organic material. The method has such features and advantages as set out above, and is particularly suitable for use in the manufacture of a non-compound semiconductor device wherein a non-compound semiconductor substrate is cleaned and a film is formed thereon.

According to a further aspect of the present invention, a semiconductor wafer is heated in a hydrogen gas, so that the surface cleaning effect by heating is added to the effect by hydrogen.

According to another aspect of the present invention, the removal of contaminants and film formation are performed in the same chamber. Therefore, there will be no need of any transfer of a semiconductor wafer to a film-forming apparatus after cleaning prior to film formation. Accordingly, contaminant factors during the process from cleaning to film-forming involved in the prior art can be excluded. As a result, surfaces or films having good characteristics are obtained.

According to another aspect of the present invention, the removal of contaminants and film formation is performed in the same chamber. Therefore, throughput is improved.

According to a still further aspect of the present invention, a load lock chamber which is connected to a film-forming chamber is provided, and a semiconductor wafer may be transferred in a vacuum to the film-forming chamber. Accordingly, contaminants which are undesirably introduced at the time of evacuation of the film-forming chamber can be suppressed, shortening the processing time.

According to another aspect of the present invention, there is provided a cluster system which comprises a plurality of film-forming chambers, a transfer chamber connected with the plural film-forming chamber in a continuous vacuum condition, and a load lock chamber connected with the transfer chamber in a continuous vacuum condition. Using this system, a semiconductor wafer is transferred in a continuous vacuum condition to individual film-forming chambers wherein the wafer is subjected to film formation in continuation without being exposed to air.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

What is claimed is:

1. A method for manufacturing a semiconductor device, said method comprising the steps of:

generating hydrogen radicals from hydrogen gas or hydrogen halide gas by heating said hydrogen gas or hydrogen halide gas by means of a hot filament in the presence of a catalyst for generating hydrogen radicals;

removing contaminants on the surface of said semiconductor wafer in said film-forming chamber using said hydrogen radicals; and forming either a conductive film or an insulating film on said surface of said wafer in said same film-forming chamber immediately after said removal of said contaminants.

2. A method according to claim 1, wherein said hydrogen gas or a hydrogen halide gas is introduced via a flow rate control means; and generating a plasma so that said semiconductor water is covered with said plasma.

3. A method according to claim 2, wherein said plasma is generated in different exciting frequencies simultaneously.

4. A method according to claim 1, wherein said hydrogen gas or a hydrogen halide gas is introduced via a flow rate control means; and said semiconductor wafer is heated from outside of said film-forming chamber.

5. A method according to claim 4, wherein said semiconductor wafer is heated from outside of said film-forming chamber at a temperature ranging from 500 to 1200°.

6. A method according to claim 1, wherein said hydrogen gas or a hydrogen halide gas is introduced via a flow rate control means;

wherein said semiconductor wafer is heated from outside of said film-forming chamber; and wherein a plasma is generated so that said semiconductor wafer is covered with said plasma.

7. The method according to claim 1, wherein the catalyst is selected from the group consisting of Ti, Pt, Ni, V, Mg, Mn, Ta and alloys thereof.

* * * * *